(12) United States Patent
Kawamura et al.

(10) Patent No.: US 6,649,265 B1
(45) Date of Patent: Nov. 18, 2003

(54) CARBON-BASED METAL COMPOSITE MATERIAL, METHOD FOR PREPARATION THEREOF AND USE THEREOF

(75) Inventors: Noriaki Kawamura, Fuji (JP); Eiki Tsushima, Fuji (JP); Nobuyuki Suzuki, Shizuoka (JP)

(73) Assignee: Advanced Materials International Company, Ltd., Fuji (JP)

( * ) Notice: Subject to any disclaimer, the term of this patent is extended or adjusted under 35 U.S.C. 154(b) by 0 days.

(21) Appl. No.: 09/600,032

(22) PCT Filed: Nov. 11, 1999

(86) PCT No.: PCT/JP99/06304

§ 371 (c)(1),
(2), (4) Date: Jul. 11, 2000

(87) PCT Pub. No.: WO00/27776

PCT Pub. Date: May 18, 2000

(30) Foreign Application Priority Data

| Nov. 11, 1998 | (JP) | 10-321021 |
| Jun. 11, 1999 | (JP) | 11-165499 |
| Jun. 22, 1999 | (JP) | 11-174895 |

(51) Int. Cl.$^7$ ................................................. B32B 5/00
(52) U.S. Cl. ................ 428/408; 428/304.4; 428/306.6; 428/312.2; 428/367; 428/389; 428/689; 427/314; 427/383.1; 427/431
(58) Field of Search ........................... 428/408, 312.2, 428/304.4, 306.6, 367, 389, 689; 427/404, 314, 431, 432, 383.1, 228, 376.1; 423/447.1, 447.2, 447.4

(56) References Cited

U.S. PATENT DOCUMENTS

| 3,928,662 A | 12/1975 | Kaneko et al. |
| 5,043,182 A | 8/1991 | Schultze et al. |

FOREIGN PATENT DOCUMENTS

| DE | A1-4100145 | 7/1991 |
| DE | 4318193 A1 | 12/1993 |
| EP | A1394817 | 10/1990 |
| EP | 0673900 A2 | 9/1995 |
| FR | 2758146 | 7/1998 |
| JP | A6249634 | 3/1987 |
| JP | 62049634 A | 3/1987 |
| JP | 02199089 A | 8/1990 |
| JP | A2199089 | 8/1990 |
| JP | A369579 | 3/1991 |
| JP | A3208361 | 9/1991 |
| JP | 03247563 A | 11/1991 |
| JP | A3247563 | 11/1991 |
| JP | A3295879 | 12/1991 |
| JP | 03295879 A | 12/1991 |
| JP | A483784 | 3/1992 |
| JP | 04083784 A | 3/1992 |
| JP | 9175877 A | 7/1997 |
| JP | A9175877 | 7/1997 |

Primary Examiner—Deborah Jones
Assistant Examiner—Abraham Bahta
(74) Attorney, Agent, or Firm—Birch, Stewart, Kolasch & Birch LLP

(57) ABSTRACT

According to the present invention, there is provided a carbon-based metal composite material comprising a carbonaceous matrix and a metal component dispersed in said carbonaceous matrix, wherein at least 90 volume percent of the pores of the carbonaceous matrix is substituted with said metal component, and the content of said metal component is 35% or less based on the total volume of said carbon-based metal composite material; a method of producing a carbon-based metal composite material wherein impregnation of the carbon formed body with molten metal under pressure is carried out by pre-heating said carbon formed body and then impregnating the open pores of the carbon formed body with molten metal under a pressure of at least 200 kg/cm$^2$ of the cross-sectional area of the plunger; and a substrate-shaped formed body for an electronic component comprising a carbon-based metal composite material.

17 Claims, 3 Drawing Sheets ated with molten copper, copper alloy or silver has been proposed in order to improve the electrical charac-
CARBON-BASED METAL COMPOSITE MATERIAL, METHOD FOR PREPARATION THEREOF AND USE THEREOF This application is the national phase under 35 U.S.C. §371 of PCT International Application No. PCT/JP99/06304 which has an International filing date of Nov. 11, 1999, which designated the United States of America.

FIELD OF THE INVENTION

The present invention relates to a novel carbon-based metal composite material, a method for its production and various applications using said carbon-based metal composite material. In more detail, it relates to a carbon-based metal composite material comprising a carbonaceous matrix and metal components dispersed in said carbonaceous matrix, a method of impregnating a carbon material with metal components, and uses of a carbon-based metal composite material, such as high thermal conductivity-low thermal expansivity substrates for packaging semi-conductors, astronautical components or general industrial structural materials having excellent specific strength and specific rigidity, heat resistant materials such as for gas turbines, and electrical contact materials having excellent sliding characteristics.

BACKGROUND OF THE INVENTION

Conventional metal composite materials containing carbon materials are produced by dispersing and orientating carbon particles or carbon fibers, as reinforcing materials, in a metal component matrix. Furthermore, there have been adopted production methods according to the so-called powder metallurgy method using graphite powder and metal powder as starting materials.

These types of metal-carbon composite materials each use carbon materials to try to improve the characteristics of the metal component, as the parent material for the composite material, and should be called metal-based carbon composite materials having a metal component as the parent material. Such materials having a much larger volume of carbon than metal component have not been realised, and these materials are therefore themselves limited in their performance.

On the other hand, carbon materials have been widely used as result of their excellent heat resistance and workability. However, they have many points that need to be improved such as being brittle, having low strength, being easily damaged, having low oxidation resistance, being difficult to plate, and having low heat conductivity. One reason for this is that, with the exception of special carbon materials, carbon materials generally have pores, as a result of which the electrical, heat and chemical properties naturally possessed by carbon are not fully exhibited.

It has been attempted to improve the characteristics of carbon materials by filling the pores of the carbon material with metal material thereby forming a carbon-metal composite. For example, a material having some of the pores substituted with molten copper, copper alloy or silver has been proposed in order to improve the electrical characteristics of carbon materials. However, it was impossible to obtain a material having a large portion of the pores substituted with metal, and its performance was not sufficient.

In general, carbon materials and molten metals have poor wettability, and it was almost impossible in previous studies to impregnate the pores of carbon materials with molten metal components. Although the wettability was improved at high temperatures, casting impregnation at high temperatures resulted in a reaction between the carbon component and the metal component. This resulted in a deterioration in the carbon material, with the problem that it was impossible to obtain the characteristics of a metal-based carbon composite material.

In other words, the production of a composite by the impregnation of a carbon material with metal components by a production method according to the conventionally proposed conditions and operations results in a reaction at the interface between the carbon component and the metal component and the generation of the metal carbide. This had, for example, the ill effect of these two components peeling away from each other, and a carbon-based metal composite material having excellent strength and other properties had not been developed.

Along with the technical development of this type of metal-carbon composite materials, there has been an increase in the amount of heat generated by electronic devices as a consequence of their improved performance and capacity, and there has been a focus on carbon-based metal composite materials having a high proportion of carbon component and having excellent strength as a high thermal conductivity-low thermal expansivity material effective for heat removal. The development of these materials is now eagerly anticipated.

DISCLOSURE OF THE INVENTION

A first objective of the present invention is, in light of the above-mentioned problems with the techniques developed to date, to provide a carbon-based metal composite material which maintains a high degree of heat resistance and high thermal conductivity as well as having a controlled thermal expansivity and excellent strength.

A second objective of the present invention is to provide a method of producing a carbon-based metal composite material comprising impregnating a molten metal into the pores of a carbon formed body whilst inhibiting reactions between carbon and the metal:

Furthermore, a third objective of the present invention is to provide a material for an electronic component having a high thermal conductivity and a controlled thermal expansivity useful for the removal of heat from an electronic component.

A fourth objective of the present invention is to provide a carbon-based metal composite material provided with an insulator film.

The inventors of the present invention have found, as result of extensive research into achieving the above-described objectives, that a high thermal conductivity-low thermal expansivity composite material can be obtained by impregnating the pores of a carbon material with a metal component under molten and pressurized conditions, and that the above-described objectives can be achieved using the same. It was on the basis of these findings that the present invention was completed.

In other words, the present invention firstly relates to a carbon-based metal composite material comprising a carbonaceous matrix and a metal component dispersed in said carbonaceous matrix characterised in that (1) at least 90 volume percent of the pores of said carbonaceous matrix are substituted with said metal component, and (2) the content of said metal component is 35% or less based on the total volume of said carbon-based metal composite material.

Furthermore, the present invention secondly relates to a method of producing a carbon-based metal composite material comprising impregnating a carbon formed body with a molten metal by contacting said carbon formed body with said molten metal under pressure, characterised in that
(1) said carbon formed body is pre-heated to a temperature at or above the melting point of said molten metal under an inert gas atmosphere; and
(2) said pre-heated carbon formed body is impregnated with said molten metal under a pressure of at least 200kg per $cm^2$ of the cross-sectional area of the plunger.

Furthermore, the present invention thirdly relates to a substrate-shaped formed body for an electronic component characterised in that it is formed from a carbonaceous metal composite material comprising a carbonaceous matrix and a metal component dispersed in said carbonaceous matrix, wherein at least 90 volume percent of the pores of said carbonaceous matrix are substituted with said metal component, and the content of said metal component is 35% or less based on the total volume of said carbonaceous metal composite material.

Furthermore, the present invention fourthly relates to a carbon-based metal composite material provided with an insulator film obtained by covering the surface of a carbonaceous metal composite material with an insulator material, the carbonaceous metal composite material having a carbonaceous matrix and a metal component dispersed in said carbonaceous matrix, wherein at least 90 volume percent of the pores of said carbonaceous matrix are substituted with said metal component, and the content of said metal component is 35% or less based on the total volume of said carbonaceous metal composite material.

BRIEF DESCRIPTION OF THE DRAWINGS

FIGS. 4-1 and 4-2 are plane and elevated views of a cooling component produced in Example 7 having a substrate on both sides.

FIGS. 5-1 and 5-2 are side and plane views of a cooling component produced in Example 8 having cooling fins on one side.

PREFERRED EMBODIMENTS OF THE PRESENT INVENTION

Figure 1:
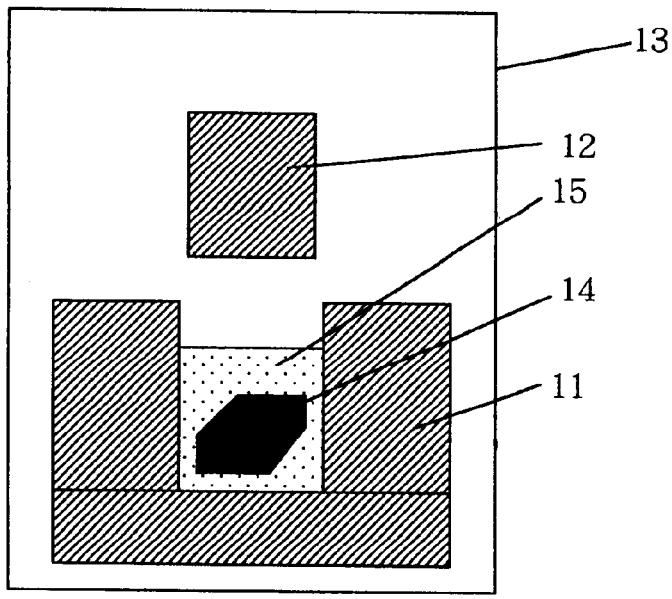
FIG. 1 is a schematic view showing the basic construction of production apparatus used in the method of producing the carbon-based metal composite material of the present invention.

The carbon-based metal composite material of the present invention comprises a carbonaceous matrix and a metal component dispersed in said carbonaceous matrix, wherein the metal component fills at least 90 volume percent of the pores of the carbonaceous matrix, and has a content of 35% or less based on the total volume of the carbon-based metal composite material.

Furthermore, one characteristic of the method of producing a carbon-based metal composite material of the present invention is that it comprises a step (1) of pre-heating a carbon formed body and a step (2) of pressurized impregnation of molten metal.

CARBONACEOUS MATRIX

The carbonaceous matrix which composes the carbon-based metal composite material of the present invention is a carbon material which can form a composite together with a metal component. Examples of carbon materials which can be used for the carbonaceous matrix include (a) general carbon materials produced with normally employed starting materials and methods; (b) carbon fiber-reinforced carbon composite materials obtained by forming a composite from carbon fibres and a carbon-containing compound; and (c) a pressure-formed body comprising carbon powder, artificial graphite powder or carbon fibers. Graphite-type carbon crystals, namely, carbon materials having specific pore structure such as pore diameter and pore volume are preferred. In this specification, these carbon materials prior to formation of a composite with the metal shall, where necessary, be referred to as a "carbon formed body". The shape of the carbon formed body can be freely selected according to the shape required in the use of the carbon-based metal composite material.

(a) General Carbon Materials

The carbon materials used as the carbonaceous matrix of the carbon-based metal composite materials of the present invention may be ones comprising amorphous carbon or graphite-type crystals, or mixtures of these. However, ones comprising graphite-type crystals are excellent in terms of uniformity of pore characteristics and are particularly preferred from the viewpoint of inhibiting the reactions with the metal component. It is important to select a graphite-type crystal having an average interplanar spacing d measured by X-ray diffraction of 0.340 nm or less.

Examples of carbon formed bodies for use as the carbonaceous matrix include ones having a porosity prior to impregnation with the metal component of less than 40 volume percent, preferably, 2 to 35 volume percent, and further preferably, 5 to 25 volume percent. Namely, ones wherein the volume percentage of the carbonaceous part is at least 60 volume percent, preferably at least 75 volume percent.

If the porosity were to exceed 40 volume percent, there is the concern that the metal component content may increase excessively making it difficult to provide both the required thermal conductivity and thermal expansivity. The pore diameter of the carbon material is not limited and may be distributed over a wide range stretching from submicrometers to several hundred microns. Examples of carbon materials include ones having an average diameter of, preferably 0.1 µm to 10 µm, further preferably, 0.1 µm to 3 µm. When the average pore diameter is thus within a specific range, the impregnation of the metal component is facilitated according to specific production conditions making it possible to increase the filling percentage to 90 volume percent or more, and furthermore to 95 volume percent or more, thereby substantially achieving a filling percentage of 100 volume percent. The filling percentage refers to the volume proportion occupied by metal impregnated into the pores.

Furthermore, it is preferred that the density of the carbon formed body prior to impregnation of the metal component is in the range of 1.4 $g/cm^3$ to 2 $g/cm^3$, preferably 16 $g/cm^3$ to 2 $g/cm^3$, and particularly 1.7 $g/cm^3$ to 1.9 $g/cm^3$. If the density is less than 1.4 $g/cm^3$, there is the ill effect of the the thermal expansivity becoming excessively large due to a high metal percentage. On the other hand, if the density exceeds 2 g/cm³, the metal impregnation-filling percentage is reduced. There is the problem that even if almost all the pores could be filled, the metal percentage would be small whereby a thermal expansivity useful for a substrate for an electronic component (4×10⁻⁶/° C. or more) cannot be achieved.

Specific examples of carbon materials for use as the carbonaceous matrix include those of electrodes used in electrolytic furnaces for electric furnace steel production, aluminium refining etc., electrodes for electric discharge machining, tools for producing silicon semiconductors or optical fibers, and carbon formed bodies used as heat resistant structural materials.

These kind of carbon materials can be produced via the main steps of mixing, forming, calcination and graphitisation etc. using a filler and binder as starting materials. Calcined oil coke, calcined pitch coke, natural graphite, calcined anthracite, carbon black etc. can be freely used as the filler, and coal tar pitch, coal tar, and synthetic resins etc. can be freely used as the binder. The operation and conditions for each of the mixing, forming, calcination and graphitisation steps may be as those employed conventionally, and can be appropriately determined to give the above-mentioned desired shape and properties. The above-mentioned graphite-type crystals can be obtained by calcination treatment in an inert gas at a temperature of 2500° C. or more, particularly, 2800° C. or more.

Extrusion, moulding and cold isostatic pressing (CIP method) can be recited as examples of methods of forming the carbon formed body. Extrusion and moulding are particularly preferred.

(b) Carbon Fiber-reinforced Carbon Composite Materials

Carbon fiber-reinforced carbon composite materials are carbon/carbon composite materials (referred to hereunder as "c/c composite materials" where necessary) constructed from carbon fibers and carbon-containing compounds. The carbon fibers are used as filler. There are provided one-dimensional, two dimensional, and three-dimensional forms of composite materials according to the manner of orientation of the fibers, starting with composite materials using fibers orientated in one direction (1D), and moving from flat arranged fibers (2D) to composite materials using 3D wovens. The type of material can be freely selected according to the use.

The c/c composite material used as the carbonaceous matrix of the carbon-based metal composite material of the present invention may also be one made from amorphous carbon, but one in which the carbon fibers or the carbon matrix or both comprise graphite-type crystals is preferred. Furthermore, in terms of density, one having a density of 1.6 g/cm³ to 2 g/cm, preferably, 1.7 g/cm³ to 1.9 g/cm³ may be used.

The pore structure of the c/c composite material may be the same as that of the afore-mentioned general carbon materials. The average pore diameter is in the range of 0.5 μm to 5 μm, preferably 1 μm to 2 μm. It is preferred to have a porosity of 5% to 30%, preferably 10% to 25%.

As mentioned above, the c/c composite material may be produced by any method. It may be produced by impregnating a carbon matrix precursor such as a phenol resin or oil pitch between the carbon fibers, followed by forming and calcination in an inert gas, normally at a temperature of 1000° C. or greater. If the calcination temperature is controlled to be 2500° C. or greater, particularly 2800° C. or greater, a graphitised crystal-containing carbon material can be obtained.

Furthermore, as a method of avoiding the re-impregnation of the matrix precursor required in conventional methods, a method comprising impregnating carbon fibers at a heat treatment temperature of 500° C. or higher with a liquid having dispersed therein carbon powder containing at least 50 weight percent of raw coke powder followed by volatising the solvent and shaping and calcinating the carbonaceous matrix precursor-containing carbon fibers under pressure (reference is made to Japanese Patent Application Laid-Open No.247563/1991) may be employed whereby a carbon material having properties favourable for the carbonaceous matrix of the carbon-based metal composite material of the present invention can be obtained.

Figure 2:
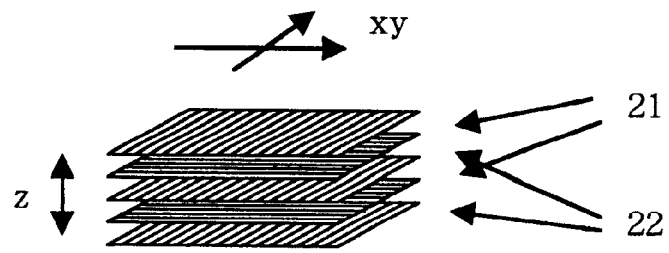
FIG. 2 is a conceptual view of a 2D carbon composite material used in Example 4.

A specific example of a carbon fiber-reinforced carbon composite material is shown in FIG. 2. In the figure, the fibers are orientated in a unilateral direction, and the respective layers are stacked with the fiber direction at 0° and 90°. Length is indicated by the xy direction, and depth by the z direction.

(c) An example of a pressure-formed body comprised of carbon powder/artificial graphite or carbon fibers is a carbon composite body obtained by filling an iron vessel with graphite powder, carbon fibers etc. and applying pressure. It has a porosity controlled to be between 10 and 30 volume percent, and is useful as a starting material for the carbonaceous matrix of the present invention. Specific examples of carbon formed bodies are ones containing at least 10 percent on a volume basis of graphite particles having a length between 1.0 mm and 3 mm, or ones containing at least 10 percent on a volume basis of pitch carbon fibers having a fiber length of 0.02 mm to 5 mm, or ones containing at least 10 percent on a volume basis of graphite particles having a length of 0 mm to 3 mm and pitch carbon fibers having a fiber length of 0.02 mm to 5 mm. These carbon formed bodies are particularly useful as the carbonaceous matrix for the substrate-shaped formed body for an electronic component discussed hereafter.

METAL COMPONENT

The metal component composing the carbonaceous metal composite material of the present invention may be freely selected according to the use. Examples include magnesium, aluminium, titanium, iron, cobalt, nickel, copper, zinc, silver, tin and alloys of each metal.

Preferred metal components include aluminium, copper, silver and alloys of these metals. Pure metal components of aluminium or copper are particularly preferred. These metal components are favourable for providing the specific thermal conductivity and thermal expansivity considered to be one of the characteristics of the carbonaceous metal composite material of the present invention.

CARBON-BASED METAL COMPOSITE MATERIAL

The carbon-based metal composite material of the present invention comprises the above-described carbonaceous matrix and a metal component dispersed in said carbonaceous matrix, wherein 1) at least 90 volume percent of the pores of the carbonaceous matrix are filled with the metal component; and 2) the content thereof is 35 percent or less based on the total volume of the carbonaceous metal composite material.

It is preferred that the above-described metal component fills the pores of the carbonaceous matrix such that it occupies at least 90 volume percent, particularly 95 volume percent of all open pores. It is further preferred that substantially 100 volume percent of the pores are filled. If the filling percentage is less than 90 volume percent, the required properties such as thermal conductivity cannot be satisfied. With the conventionally proposed methods of impregnating molten metal, a value of 70 volume percent was achieved at best; there was no disclosure of a material having a high filling percentage. The carbonaceous matrix is amorphous carbon, graphite-type crystalline carbon and a mixture of these. Graphite-type carbon is particularly preferred. The form in which the metal component exists in the carbonaceous matrix can be observed using a scanning electron microscope.

Next, the content of the metal component in the carbon-based metal composite material of the present invention is 35 volume percent or less, preferably 30 volume percent or less, and further preferably, between 5 and 25 volume percent. If the content exceeds 35 volume percent, it becomes difficult to achieve a low thermal expansivity even though a high thermal conductivity may be achieved.

The density of the above-described carbon-based metal composite material of the present invention will vary depending on the type of metal component, but when aluminium is used as the impregnant, the density is in the range of 2 g/cm$^3$ to 2.4 g/cm$^3$, preferably 2.1 g/cm$^3$ to 2.2 g/cm$^3$, whereby a material having a thermal conductivity of 200 W/(m·K) or more, and a coefficient of a thermal expansion of $12 \times 10^{-6}$/° C. or less, particularly from $4 \times 10^{-6}$/° C. to $12 \times 10^{-6}$/° C. can be provided.

There are no particular limitations with respect to the shape of the carbon-based metal composite of the present invention. It can be formed into various shapes at the stage of production depending on the use. For example, it may be formed into plates, blocks, sheets, films, granules, powder, fibers and woven fibers, non-woven fibers and shaped parts such as arbitrarily machined parts.

METHOD OF PRODUCING THE CARBON-BASED METAL COMPOSITE MATERIAL

Next, a method of producing the carbon-based metal composite material of the present invention shall be described. According to the present invention, there is provided a method of producing a carbon-based metal composite material comprising the pressurised impregnation of a carbon formed body with molten metal by contacting the carbon formed body with the molten metal under pressure, the method including the following steps (1) and (2).

(1) step of pre-heating the carbon formed body in an inert gas atmosphere at a temperature at least as high as the melting point of the molten metal; and
(2) step of impregnating the pre-heated carbon formed body with said molten metal at a pressure of 200 kg per cm$^2$ of the cross-sectional area of the plunger.

Any carbon material suitable for the above-described carbonaceous matrix can be used as the carbon formed body. A specific example of a carbon formed body is one having a density of 1.4 g/cm$^3$ to 2 g/cm$^3$, and a porosity of 50% or less, preferably, 35% or less, and further preferably, 5% to 25%.

Specifically, in the above-described step (1), the carbon formed body is placed into a mold and pre-heated in an inert gas atmosphere. Argon gas, nitrogen gas etc. may be used as the inert gas atmosphere. In the pre-heating, the temperature is maintained at or above, particularly at least 100° C. above, and preferably of 100° C. to 250° C. above the melting point of the metal component. By proceeding via this step (1), the pores of the carbon material can be sufficiently impregnated with the metal whilst inhibiting reactions at the interface between carbon and the metal.

Next, in step (2), the metal component is preferably heated to a temperature from 50° C. to 250° C. higher than the melting point of the metal component and supplied to the mold to contact it with the above-mentioned pre-heated carbon formed body. A pressure of at least 200 kg per cm$^2$ of the cross-sectional area of the plunger is applied to impregnate the above-mentioned carbon formed body with the molten metal. In the case that aluminium is used in step (2), increasing the temperature of the molten metal to more than 200° C. above the melting point results in a tendency for deliquescent aluminium carbide to be formed whereby a practical composite material cannot be obtained. Furthermore, if the pressure is less than 200kg/cm$^2$, the impregnation of the metal cannot be carried out efficiently with a resulting decrease in the filling percentage.

The impregnation of the molten metal in the method of producing the carbon-based metal composite material of the present invention is characterised by the use of the plunger for a squeeze casting of a pressure applicator of a standard press to inject the molten metal into the carbon formed body placed inside the mold and directly apply pressure thereto. It is thereby possible to obtain a composite material having a high filling percentage which was not possible with the conventional gas pressure methods carried out in the presence of a gas inside a pressure-resistant vessel. It is also possible to obtain a large scale composite material which was not possible with the prior art.

After the completion of step (2), a carbon-based metal composite material can be obtained via steps such as cutting etc.

In the case of a metal having a high melting point, the impregnation of the metal component can also be carried out by forming holes in the carbon formed body and injecting the molten metal into the holes.

A specific example of apparatus used in the method of producing a carbon-based metal composite material according to the present invention is shown in FIG. 1.

In FIG. 1, 11 is a metal mold, 12 is a plunger and 13 is a press. A carbon formed body 4 is placed inside the mold 11, and is then pre-heated in argon gas according to the above-described step (1). Molten metal heated to a specific temperature is then supplied, and plunger 12 is used to apply pressure to the molten metal inside the metal mold and maintain these same conditions for a specified period of time. After the elapse of the specific period of time, the whole mass of metal is removed from the mold and cut to obtain a metal-impregnated carbon-based composite material.

SUBSTRATE-SHAPED FORMED BODY FOR AN ELECTRONIC COMPONENT

Next, (1) a substrate-shaped formed body useful as a heat disperser for an electronic component, and (2) a substrate-shaped formed body provided with a cooling device shall be described as uses of the carbon-based metal composite material of the present invention.

In electronic components which are provided with an electronic circuit supporting substrate for an electronic circuit comprising semiconductor elements, resistors, transformers, condensors and wiring and with a base substrate for supporting the electronic circuit supporting substrate; most of the heat generated by the electronic circuit is transferred from the electronic circuit supporting substrate and base substrate to a cooling device and is finally released to the atmosphere or to a cooling liquid. Conventionally, aluminium, copper or alloys of these were used as the base substrate material, but there is a problem of warping and peeling as a result of a difference in thermal expansivity with the electronic circuit.

The carbon-based metal composite material of the present invention has a thermal conductivity of at least 150 W/(m·K) and a thermal expansivity in the range of $4 \times 10^{-6}/°$ C. to $12 \times 10^{-6}/°$ C.; it has improved substrate characteristics compared to the above-described metal base substrates thus solving the above-discussed problems.

The substrate-shaped carbon formed body for electronic components according to the present invention preferably has a density of at least 2 g/cm$^3$. Specifically, in the case of aluminium- or aluminium alloy-impregnated substrate-shaped carbon formed bodies, a density of 2 g/cm$^3$ to 2.4 g/cm$^3$ is suitable, whereas in the case of a copper- or copper alloy-impregnated substrate-shaped carbon formed body, a density in the range of 2.3 g/cm$^3$ to 4.6 g/cm$^3$ is suitable.

Figure 3:
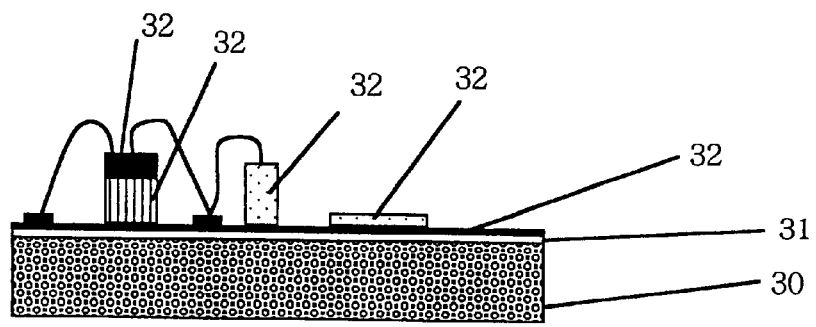
FIG. 3 is a cross-sectional view of an electronic component showing an example of a use of a carbon-based metal composite material substrate of the present invention.

A specific example of an electronic component including a substrate-shaped carbon formed body comprising a carbon-based metal composite material according to the present invention and used as a heat disperser for an electronic circuit is shown in FIG. 3.

In the figure, a substrate 30 comprising the carbon-based metal composite material of the present invention is joined to a ceramic insulating substrate 32 via an adhesive layer 31. Synthetic resin, solder, metal brazing material etc. is used for the adhesive layer. A circuit, circuit elements and parts 33 are provided on the ceramic insulating substrate 32. A large amount of heat is generated from the circuit, circuit elements and parts which is transferred to the substrate 30 and relased to a cooling device (not shown in the figure) joined to the bottom of the substrate 30.

Next, a substrate-shaped formed body provided with a cooling device for an electronic component shall be described as a use of the carbon-based metal composite material of the present invention.

Figures 1, 4:
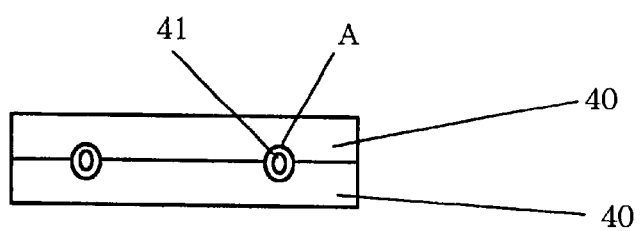
Figures 2, 4:
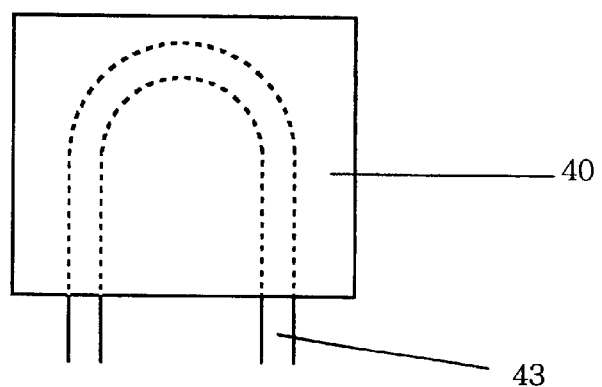

The substrate-shaped formed body provided with a cooling device is obtained by simultaneously casting a carbon formed body and cooling device into an integrated body via the metal component at the time of impregnating the carbon formed body with the metal component. The cooling device is made up of passages such as pipes for passing a liquid or fins for gas cooling. Specific examples of substrate-shaped formed bodies provided with cooling devices are shown in FIGS. 4-1 to 5-2. FIGS. 4-1 and 4-2 show a plane view and elevation view of a cooling part having a substrate-shaped formed body on both sides. Two substrate-shaped formed bodies 40 are prepared, and a semi-circular groove A is cut into each of the formed bodies. A pipe 41 is fitted into the groove, and then the two bodies are provisionally fastened together. The substrate-shaped bodies and the cooling device are integrated together by filling the space between the formed bodies and the pipe with molten metal at the same time as impregnating the pores with molten metal. In this way, the cooling performance can be improved.

Figures 1, 5:
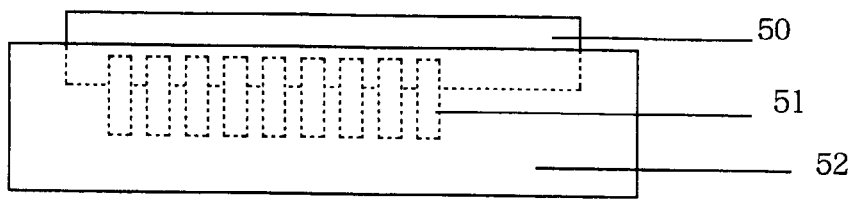
Figures 2, 5:
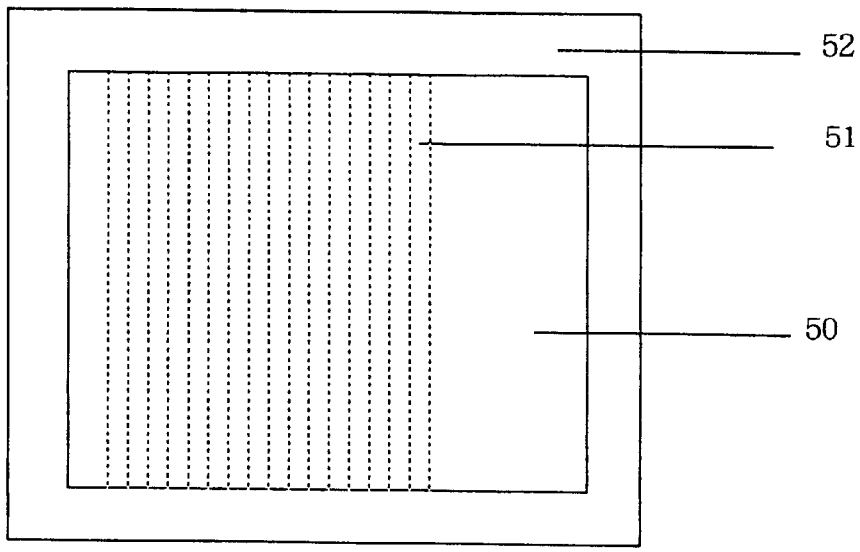

FIGS. 5-1 and 5-2 show another embodiment consisting of a substrate for an electronic component having fins 51 joined to the bottom of a substrate-shaped formed body 50. The surface of a metal mold 52 is coated with a mold-release material made of carbon or BN powder, and then the carbon formed body 50 and thin plates 51 are placed in the mold. The thin plates 51 are metal plates having a melting point higher than the carbon formed body or the metal to be impregnated, and form the fin blades. They are fitted into grooves provided in the carbon-formed body. The top of FIG. 5-1 is a front view showing the electronic component substrate having the fins 51 joined to the carbon formed body 50 and placed in the metal mold 52 ready for impregnation with molten metal; FIG. 5-2 is a plane view thereof.

CARBON-BASED METAL COMPOSITE MATERIAL PROVIDED WITH AN INSULATING FILM

As another use of the carbon-based metal composite material of the present invention, there can be provided the same with its surface covered with an insulating material. Examples of insulating materials include plastic materials such as polyimide resins, polyaminobismaleimides, bismaleimides, polyetheramides, polyamideimides, epoxys, polyurethanes, polyesters and ceramic materials such as alumina, aluminium nitride, silica, silicon nitride, titanium oxide, zirconia and glasses. The thickness of the covering layer of insulating material is 0.6 mm or less, preferably 0.1 mm to 0.1 mm. There are no limitations regarding the method of forming the covering layer, and any method may be used. It is preferably formed by a sputtering method, coating method, CVD method, solgel method etc.

Figure 6:
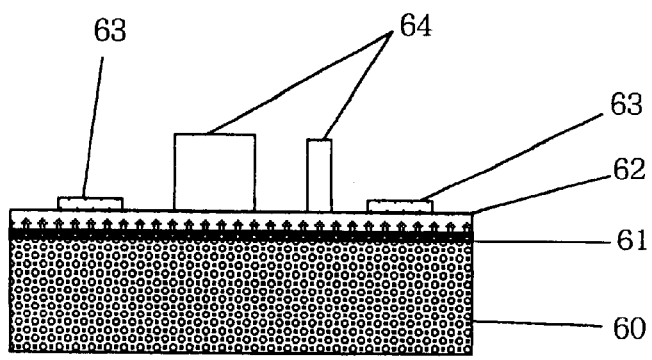
FIG. 6 is a cross-sectional view of an electronic component showing a use of a carbon-based metal composite material provided with an alumina film produced in Example 9.

The carbon-based metal composite material of the present invention has a Young's modulus of 30 GPa or less, a thermal conductivity of 100W/(m·K) or more, and a thermal expansivity of $12 \times 10^{-6}/°$ C. or less. An insulator-covered carbon-based metal composite material obtained using this can be used as an electronic device with a circuit laid directly on the insulating film. This application example is shown in FIG. 6. In FIG. 6, the carbon-based metal composite material of the present invention is used as a substrate and an insulating film 62 is provided thereon via a joining layer 61; an electronic circuit may be provided thereon. In the figure, 64 is an electronic component such as a semiconductor element, a resistor or a condenser.

To describe it in more detail, the carbon-based metal composite material of the present invention has a similarly low thermal expansivity and a Young's modulus one order lower compared to a composite material substrate produced by impregnating a powder sintered body of silicon carbide, alumina, tungsten etc. with metal; and the top thereof can thus be covered with a ceramics electrically insulating film having good film properties and resistant to heat cycles. An electronic circuit can be provided on top of this insulating film, whereby an electronic component having excellent thermal conductivity can be produced.

EFFECT OF THE INVENTION

The carbon-based metal composite material of the present invention has, by virtue of the above-described construction, at least 90 volume percent, particularly 95 volume percent up to 100 volume percent of the pores of the carbonaceous matrix filled with the metal component. Furthermore, the metal component content is controlled to be no more than 35% based on the total volume of the carbon-based metal composite material. By virtue of this composition, the carbon-based metal composite material of the present invention has a high thermal conductivity/low thermal expansivity characteristic, and can be provided as a substrate-shaped carbon formed body for an electronic component. Furthermore, in this type of carbon-based metal composite material, the pores can be impregnated with the molten metal at a high filling percentage by carrying out the impregnation of the pores of the carbon formed body with the molten metal instantaneously at high pressure; furthermore, in the case of aluminium impregnation, it is realised by inhibiting reactions between aluminium and carbon which was not possible with conventional techniques.

EXAMPLES

Hereunder, the present invention shall be specifically described by Examples and Comparative Examples. The present invention is, however, not to be limited in any way by these Examples etc.

Measurement methods and test methods were used for the evaluation of the quality and performance of the carbon-based metal composite materials prepared according to the Examples and Comparative Examples.

1) Impregnation of the Metal Component

The state of dispersion of the metal component was observed at a magnification ratio of ×500 using a scanning electron microscope S2300 made by Hitachi Ltd.

2) Porosity

The porosity of the carbon formed body prior to impregnation with the metal component is a calculated value calculated assuming the carbon density to be 2.1 g/cm$^3$ from its apparent density.

3) Metal Filling Percentage

[(Porosity prior to metal filling–porosity after metal filling)/porosity prior to metal filling)]×100

4) Specific Heat

Measured at room temperature in a flow of dry nitrogen at a temperature rise of 10° C./min. according to the DSC method (DSC: differential scanning calorimeter) using a DSC-2 made by the Perkin Elmer company. Sapphire was used for the comparative calibration.

5) Density

Measured according to the Archimedes method using an electronic analysis balance AEL-200 made by Shimadzu Corporation.

6) Bending Strength

The bending strength of a prepared strength test piece was measured using a precision universal testing machine AG-500 made by Shimadzu Corporation. It was measured under the following conditions: test piece size 4 mm×4 mm×8 mm; span distance 60 mm; crosshead lowering speed 0.5 mm/min.

7) Thermal Conductivity

The thermal conductivity was determined as the multiple of the thermal diffusivity, specific heat and density. The thermal diffusivity was measured at 25° C. according to the laser flash method using a TC-7000 made by Shinku Riko Kabushiki Kaisha. Ruby laser light (excitation voltage:2.5 kV; 1 homogenising filter and 1 attenuation filter) was used for the irradiation.

8) Thermal Expansivity (Coefficient of Thermal Expansion)

The thermal expansivity from room temperature to 300° C. was measured using thermal analysis device 001, TD-5030 made by the Max Science company.

Example 1

Commerically available artificial graphite I (density: 1.85 g/cm$^3$, porosity: 12%, bending strength: 3.5kg/cm$^3$, thermal conductivity: 100 W/(m·K), thermal expansivity: 3.8×10$^{-6}$/° C.) was cut into a block having a length of 30 mm, a width of 30 mm and a depth of 10 mm. The block was placed in an iron mold and heated in argon gas to 750° C. for 90 minutes. Next, molten aluminium obtained by heating pure aluminium granules to 750° C. was added into the mold, and a pressure of 500kg per cm$^2$ of the cross-sectional area of the plunger(the ram) was applied. This state was maintained for 30 minutes to impregnate the pores of the artificial graphite with aluminium and form the composite. After cooling, the whole mass of aluminium was removed and cut to obtain a carbon-based aluminium composite material having an aluminium content of 12 volume percent.

The nature of the impregnation of the aluminium in the thus obtained carbon-based aluminium composite material was observed by the above-described method. It could be confirmed that the pores had been 100% substituted by the aluminium, and that the aluminium was dispersed uniformly in the carbonaceous matrix.

A strength test piece was prepared and subjected to a bending test. The result was a bending strength of 8 kg/mm$^2$. The results are shown in Table 1. It can be seen from this that the bending strength had increased to twice the bending strength (4 kg/mm$^2$) of the artificial graphite I not impregnated with aluminium.

Furthermore, the thermal conductivity and the thermal expansivity were respectively measured by the above-described methods. These results are shown in Table 1. The thermal conductivity had increased to 200 W/(m·K), which is twice that of the artificial graphite I (100 W/(m·K), and the thermal expansivity had risen from 3.8×10$^{-6}$/° C. to 10.8×10$^{-6}$/° C.

Example 2

Commerically available artificial graphite I was cut into a block having a length of 30 mm, a width of 30 mm and a depth of 10 mm. The block was placed into a carbon mold and heated in argon gas to 1200° C. for 120 minutes. Next, molten copper obtained by heating pure copper granules to 1200° C. was added into the mold, and a pressure of 1000 kg per cm$^2$ of the cross-sectional area of the ram was applied. This state was maintained for 30 minutes to impregnate the pores of the artificial graphite with copper and form the composite. After cooling, the whole mass of copper was removed and cut to obtain a carbon-based copper composite material having a copper content of 14 volume percent.

The nature of the copper impregnation in the thus obtained carbon-based copper composite material was observed by the above-described method. No pores were observed, and it could be confirmed that the copper was dispersed uniformly in the carbonaceous matrix.

A strength test piece was prepared and subjected to a bending test. The result of the test is shown in Table 1. It can be seen from this that the bending strength had increased to twice the bending strength (4 kg/mm$^2$) of the commercial product I.

Furthermore, the thermal conductivity and the thermal expansivity were respectively measured by the above-described methods. These results are shown in Table 1. The thermal conductivity had increased to 220 W/(m·K), which is more than twice that of the commercial product I (100 W/(m·K), and the thermal expansivity had risen from 3.8×10$^{-6}$/° C. to 9.9×10$^{-6}$/° C.

Example 3

Holes of a diameter of 10 mm and a depth of 100 mm were formed in a block of commerically available artificial graphite I. After vacuum degassing, it was heated in argon gas to 1550° C. for 210 minutes. Pure molten nickel heated to 1650° C. was then filled into the holes. A plunger was then inserted therein whilst blowing the outer surface of the block with argon, and a pressure of 1000 kg per cm$^2$ of the cross-sectional area of the plunger was applied. This state was maintained for 30 minutes to impregnate the pores of the block of artificial graphite I with nickel. After cooling, the portion of the block impregnated with nickel was removed and cut to obtain a carbon-based nickel composite material having a nickel content of 12 volume percent.

The nature of the nickel impregnation in the thus obtained carbon-based nickel composite material was observed, and the bending strength, thermal conductivity and thermal expansivity were respectively measured. The nature of the nickel impregnation was observed with the following results: no pores were observed and it could be confirmed that the nickel was dispersed uniformly in the carbonaceous matrix.

The bending strength had increased to 11 kg/mm$^2$, which is about three times the bending strength (4 kg/mm$^2$) of the commerical artificial graphite I; the thermal conductivity had increased from the 100 W/(m·K) of the commercial artificial graphite I to 170 W/(m·K), and the thermal expansivity had become $7.5 \times 10^{-6}/°$ C. compared to the $3.8 \times 10^{-6}/°$ C. of the commcercial artificial graphite I.

These results are shown in Table 1.

Example 4

A block having a length (xy direction) of 100 mm, a width of 100 mm, and a depth (z direction) of 250 mm was prepared from a carbon fiber (pitch-type)-reinforced carbon composite material produced according to Japanese Patent Application Laid-Open Nos.247563/1991 and 157273/1996 with stacks of fibers orientated at 0° and 90° (hereunder referred to as "2D carbon composite material" (refer to FIG. 2)).

Holes of a diameter of 10 mm and a depth of 100m were formed in the block of 2D carbon composite material. After vacuum degassing, it was heated in argon gas to 1550° C. for 210 minutes. Pure molten nickel heated to 1650° C. was then filled into the holes, whilst cooling the outer surface of the block by blowing with argon gas. A pressure of 500 kg per cm$^2$ of the cross-sectional area of the plunger was applied, and this state was maintained for 30 minutes to impregnate the pores of the block of 2D carbon composite material with nickel. After cooling, the portion of the block impregnated with nickel was removed and cut to obtain a carbon-based nickel composite material.

The nature of the nickel impregnation was observed; no pores could be observed and it could be confirmed that the nickel was dispersed uniformly in the carbonaceous matrix. The nickel content was 25 volume percent.

A bending strength test piece was prepared and subjected to a bending test. The result is shown in Table 1. According to this result, the bending strength had increased 2.5 times in the xy plane from 20 kg/mm$^2$ prior to impregnation to 50 kg/mm$^2$, and had increased in the z plane from less than 1 kg/mm$^2$ to 5 kg/mm$^2$.

The results of measuring the thermal conductivity are shown in Table 1. The thermal conductivity in the vertical direction with respect to the xy plane, i.e. in the z-axis direction had increased from 8 W/(m·K) prior to impregnation to 45 W/(m·K), and the thermal conductivity in the direction of the x- or y-axis had increased from 200 W/(m·K) prior to impregnation to 250 W/(m·K).

A nickel-impregnated test piece of 10 mm length and 3 mm in the vertical and horizontal directions was cut, and the surface thereof was covered with nickel to a total thickness of about 10 μm using electrolytic plating and non-electrolytic plating. This sample was placed in an air furnace and left at 1000° C. for 1 hour. After cooling, it was removed and observed visually. There was no change other than that the nickel had darkened. On the other hand, a sample of the non-impregnated 2D composite material became reduced in mass to 38% of its original weight.

Comparative Example 1

A carbon-based aluminium composite having an aluminium content of 9.8 volume percent was obtained in the same way as Example 1 except that the molten aluminium heated to 750° C. was added to the block of commercial artificial graphite I without preheating the block of commercial artificial graphite in argon gas. Observation of the nature of the aluminium impregnation showed that there were spaces in the open pores which had not been filled and that no more than 67 volume percent of the pores of the artificial graphite had been substituted with aluminium. The thermal conductivity was 133 W/(m·K) and the thermal expansivity was $9.7 \times 10^{-6}/°$ C.; the thermal conductivity was insufficient. The results of the evaluation of the properties are shown in Table

Comparative Example 2

Aluminium impregnation was carried out in the same way as Example 1 except that the pressure was 150 kg per cm$^2$ of the cross-sectional area of the plunger. It was almost impossible to impregnate any aluminium, and a carbon-based aluminium composite material having satisfactory properties could not be obtained. The aluminium filling percentage was 47 volume percent, and its content was 12%. The thermal conductivity was 121 W/(m·K) and the thermal expansivity was $9.3 \times 10^{-6}/°$ C.

Comparative Example 3

An aluminium-impregnated carbon-based aluminium composite was prepared in the same way as Example 1 except that the composition was adjusted to give an aluminium content of 40 volume percent. The results of measuring the bending strength, thermal conductivity and thermal expansivity are shown in Table 1. The aluminium filling percentage was favourable at 100%, but the thermal expansivity was excessively high at $13.5 \times 10^{-6}/°$ C. giving a material of practically no use.

Comparative Example 4

An aluminium-impregnated carbon-based aluminium composite material was obtained in the same way as Example 1 except that the pre-heating temperature was set to 600° C. which is below the melting point of aluminium. The results of evaluating the properties are shown in Table 1. The aluminium filling percentage was low at 73 volume percent and there were problems with the thermal conductivity.

Comparative Example 5

A carbon-based aluminium composite material was prepared in the same way as Example 1 except that a carbon formed body (average interplanar spacing $\bar{d}_{002}=0.343$ nm) obtained by calcinating needle-shaped coke, pitch and phenol resin for 3 hours at a final temperature of 2000° C. was used instead of artificial graphite. The properties are shown in Table 1.

This carbon formed body produced bubbles and broke up when soaked in water.

Furthermore, when 30 nm cubes were left in air, they gradually powderised and after about two weeks had completely lost their original shape and become a powder body. It is supposed that this is caused by the formation of aluminium carbide by a reaction between the carbon and aluminium.

TABLE 1

|  | Porosity (Vol. %) | Metal Filling Percentage (Vol. %) | Bending Strength kg/mm$^2$ | Thermal Conductivity W/(m.K) | Thermal Expansivity × 10$^{-6}$/° C. |
|---|---|---|---|---|---|
| Basic material: Commercial artificial graphite material I | 12 | 0 | 4 | 100 | 3.8 |
| Example 1: Aluminium Impregnation | 0 | 100 | 8 | 200 | 10.8 |
| Example 2: Copper Impregnation | 0 | 100 | 8 | 220 | 9.9 |
| Example 3: Nickel Impregnation | 0 | 100 | 11 | 170 | 7.5 |
| Comp. Example 1: Aluminium Impregnation | 5 | 67 | 6 | 133 | 9.7 |
| Comp. Example 2: Aluminium Impregnation | 8 | 47 | 5 | 121 | 9.3 |
| Comp. Example 3: Aluminium Impregnation | 0 | 100 | 10 | 170 | 13.5 |
| Comp. Example 4: Aluminium Impregnation | 4 | 73 | 6 | 138 | 9.9 |
| Parent material: Needle-shaped coke formed body | 25 | 0 | 2 | 70 | 1.8 |
| Comp. Example 5: Aluminium Impregnation | 0 | 100 | 6 | 131 | 7.6 |
| Parent Material: 2D Carbon Composite XY direction | 25 | 0 | 20 | 200 | 0 |
| 2D Carbon Composite Z direction |  |  | <1 | 8 | 7 |
| Ex. 4: 2D Carbon Composite + Nickel Impregnation XY direction | 0 | 100 | 50 | 250 | 0 |
| 2D Carbon composite + Nickel Impregnation Z direction |  |  | 5 | 50 | 10 |

Note: "2D Carbon Composite" refers to a composite material produced by layer-stacking with the fibers directed in orthogonal directions; the xy direction is the fiber face, and the z direction is the stacked layer face.

Example 5

A total of four types of carbon formed bodies, including 3 types of commercially available artificial graphite materials A, B and C, and one type of carbon-fiber/carbon composite material were respectively heated to 760° C. in argon gas for 90 minutes, and placed in molds heated to 500° C. The molds were filled with pure aluminium melted at 810° C. A press was used to apply a pressure of 500 kg per cm$^2$ of the cross-sectional area of the plunger, and this state was maintained for 30 minutes. After cooling, the whole mass of aluminium was removed and cut to obtain a carbon-based aluminium composite material. The aluminium filling percentage ranged from 96 volume percent to 100 volume percent; and the content ranged from 7.7 volume percent to 27 volume percent.

The thermal conductivities, thermal expansivites and bending strengths are shown in Table 2.

TABLE 2

|  |  | Density g/cm$^3$ | Thermal Conductivity W/m.K. | Thermal Expansivity ×10$^{-6}$/° C. | Bending Strength kg/mm$^2$ | Porosity Vol. % | Metal Filling percentage (Vol. %) |
|---|---|---|---|---|---|---|---|
| *Example 5* |  |  |  |  |  |  |  |
| Artificial Graphite A | Post-Impreg. | 2.17 | 340 | 6 | 3 | 1 | 97 |
|  | Pre-Impreg. | 1.82 | 160 | 1 | 1 | 13 | 0 |
| Artificial Graphite B | Post-Impreg. | 2.26 | 200 | 7 | 5 | 0 | 100 |
|  | Pre-Impreg. | 1.53 | 100 | 3 | 2 | 27 | 0 |
| Artificial Graphite C | Post-Impreg. | 2.17 | 190 | 8 | 10 | 0 | 100 |
|  | Pre-Impreg. | 1.85 | 100 | 4 | 5 | 12 | 0 |
| Carbon fiber/carbon composite | Post-Impreg. | 2.14 | 450 | 11 | — | 0.3 | 96 |
|  | Pre-Impreg. | 1.93 | 400 | 7 | — | 8 | 0 |
| *Comparative Example 6* |  |  |  |  |  |  |  |
| Artificial Graphite A | Post-Impreg. | 2.07 | 250 | 5 | 2 | 4 | 70 |
|  | Pre-Impreg. | 1.82 | 160 | 1 | 1 | 13 | 0 |

Note:
Artificial Graphite A: Maximum Particle Diameter 3 mm
Artificial Graphite B: Maximum Particle Diameter 0.8 mm
Artificial Graphite C: Maximum Particle Diameter 0.1 mm
Carbon fiber/carbon composite: thermal conductivity-value in fiber direction
thermal expansivity-value in direction orthogonal to fiber direction

Comparative Example 6

A carbon-based aluminium composite material was obtained in the same way as Example 5 except that the pure aluminium melted at 810° C. was added without pre-heating the artificial graphite material A in the mold. The aluminium filling percentage was 70 volume percent, and the aluminium content was 9.1 volume percent. The thermal conductivity, thermal expansivity and bending strength are shown in Table 2. The degree of increase in the thermal conductivity between prior to and after impregnation of this carbon-based composite material was low.

Example 6

Two types of carbon formed body, commercially available graphite materials A and B, were used. Each carbon formed body was respectively pre-heated to 960° C. in argon gas for 120 minutes, and then placed in a mold heated to 600° C.

The mold was then filled with 7-3 brass melted at 960° C. A pressure of 1000 kg per cm² of the cross-sectional area of the plunger was applied, and this state was maintained for 30 minutes to impregnate the carbon formed body with the 7-3 brass and form the composite. After cooling, the whole mass of 7-3 brass was removed and cut to obtain a carbon-based 7-3 brass composite material.

The 7-3 brass filling percentage was 94 volume percent and the 7-3 brass content was 12 volume percent and 25 volume percent.

The results of measuring the thermal conductivity, thermal expansivity and bending strength are shown in Table 3.

argon gas for 90 minutes. Aluminium (JISAC4CH) melt was poured in and cast at a pressure of 500 kg/cm². After cooling, it was cut to obtain the substrate-shaped carbon formed body for an electronic component shown in FIG. 4. The aluminium filling percentage of the formed body was 99 volume percent and the aluminium content was 12 volume percent; the thermal conductivity and thermal expansivity were 200 W/(m·K) and 5×10⁻⁶/° C., respectively.

Example 8

A substrate produced by subjecting a carbon composite body having carbon fibers orientated in a single direction to cutting orthogonally to the fiber direction was used to provide a carbon formed body of length 50 mm, width 50 mm and depth 10 mm. 20 grooves of length 50 mm, width 1 mm and depth 2 mm were cut into the carbon formed body at a pitch of 2 mm. Thin plates of length 50 mm, width 20 mm and depth 0.9 mm and cut from artificial graphite material were inserted into the grooves. This was then provisionally fitted via a mold-release agent in a mold made from steel material. This was then placed in a mold and pre-heated to 750° C. in argon gas. Aluminium (JISSAC4CH) melt was poured in and cast at a pressure of

TABLE 3

|  |  | Density g/cm³ | Thermal Conductivity W/(m.K.) | Thermal Expansivity ×10⁻⁶/° C. | Bending Strength kg/mm² | Porosity Vol. % | Metal Filling percentage (Vol. %) |
| --- | --- | --- | --- | --- | --- | --- | --- |
| Artificial Graphite A | Post-Impreg. | 2.91 | 200 | 5 | 2 | 0.8 | 95 |
|  | Pre-Impreg. | 1.82 | 160 | 1 | 1 | 13 | 0 |
| Artificial Graphite B | Post-Impreg. | 3.75 | 190 | 6 | 3 | 1.6 | 95 |
|  | Pre-Impreg. | 1.53 | 100 | 3 | 2 | 27 | 0 |

Note:
Artificial graphite material A: max. particle diameter 3 mm
Artificial graphite material B: max. particle diameter 0.8 mm The following points were clear from the results of Examples 5 and 6. The thermal conductivity had risen by up to 100 W/(m·K) compared to the carbon formed body prior to impregnation, making it possible to achieve a thermal conductivity of 200 W/(m·K) or greater which is demanded for the base substrate of an electronic component. Furthermore, it is shown that the thermal expansivity could be freely controlled from 5×10⁻⁶/° C. to 11×10⁻⁶/° C. by selecting the type of metal or type of carbon formed body. This thermal expansivity is similar to that of silicon (3×10⁻⁶/° C. to 4×10⁻⁶/° C.), and that of aluminium nitride (4.5×10⁻⁶/° C.) or alumina (7×10⁻⁶/° C.), which are each mounted on the substrate. Accordingly, a substrate employing the carbon-based metal composite material of the present invention can reduce the amount of thermal stress produced by differences in thermal expansivity between the substrate and electronic components mounted thereon, making it possible to inhibit the generation of defects such as warping and peeling.

Example 7

Commercially available artificial graphite was cut to prepare two carbon formed bodies of length 100 mm, width 100 mm and depth 10 mm for use as substrates. A semicircular-shaped groove of diameter 12 mm was cut into the substrates; a stainless steel pipe of external size 9.5 mm and preformed to match the grooves was sandwiched and provisionally fixed between the two substrates. This was then placed in a metal mold and pre-heated to 750° C. in 500 kg/cm². After cooling, it was removed from the mold and cut (refer to FIG. 5-1 and FIG. 5-2). The aluminium filling percentage was 99 volume percent and the aluminium content was 9 volume percent; the thermal conductivity and the thermal expansivity were 400 W/(m·K) and 10×10⁻⁶/° C., respectively.

Comparative Example 7

A carbon formed body indentical to the carbon formed body of Example 7 was prepared as a substrate, and a substrate-shaped carbon formed body for an electronic component comprising a carbon-based aluminium composite material was obtained in the same way as Example 7 except that the aluminium impregnation was carried out without pre-heating the carbon formed body. The aluminium filling percentage was 40 volume percent, the aluminium content was 5 volume percent, the thermal conductivity was 124 W/(m·K) and the thermal expansivity was 6×10⁻⁶/° C.

In Example 7, observation of a cut face of the carbon formed body with a microscope revealed that the aluminium had completely filled the spaces in the carbon formed body. Furthermore, the gap between the stainless steel pipe and the substrates was filled with aluminium without any spaces thereby achieving integration. In Comparative Example 7, the filling of the spaces of the carbon formed body was not complete, and the integration was not sufficient. The thermal expansivity of the substrates of Examples 7 and 8 was close to that of silicon, alumina and aluminium nitride. Furthermore, there were no spaces at the interface joining the substrates and the cooling pipe or fins resulting in excellent thermal conductivity.

Example 9

A carbon-based copper composite material produced by impregnating a unidirectionally orientated carbon-fiber carbon composite having a porosity of 8% with molten copper at high pressure according to the method of Example 1 was used to prepare a 30 mm substrate piece having a thickness of 3 mm (thickness direction is longitudinal direction of fibers). The copper filling percentage was 93 volume percent, the copper content was 7.4 volume percent, and the density was 2.6 g/cm³. A metal film mainly comprising molybdenum and chromium and having a thickness of 10 microns was formed on the substrate by plasma spraying. White alumina having a purity of 99.6% and an average particle diameter of 1 μm was plasma sprayed onto this metal film to prepare a ceramics film with a total film thickness of 0.1 mm with the metal coating. Since pinholes were present in this film, a glass flit was thinly laid on the film and calcined at 900° C. An aluminium foil of thickness 10 μm was laid on this film, and then a copper foil of thickness 0.3 μm was stacked on top thereof. It was then treated using a hot press for 30 minutes at 2MPa and 650° C. to obtain a copper plated substrate. An example of the use in an electronic component of a carbon-based metal composite material provided with an insulating film is shown in FIG. 6. In the figure, a ceramics insulating film 62 is provided on a substrate (60) employing the carbon-based metal composite material via a joining layer (61) of solder. An electronic circuit (63) and electronic parts (64) are directly provided on top of this film.

In order to confirm the electrical insulating properties of the ceramics film, a potential difference of 500V was applied between the carbon-based metal composite material substrate and the copper plate and the electrical resistance was measured using an electrical insulation tester. The electrical resistance was infinitely large thereby confirming the electrical insulating properties of the ceramics film.

Example 10

The surface of a 10 mm carbon-based copper composite material substrate similar to that of Example 9 and having a thickness of 1 mm was polished to give an average surface roughness of 0.1 μm. A magnetron sputtering device was used to form an alumina film of 0.03 mm on the substrate by flowing 10 ml per minute of a gas mixture consisting of 9 parts argon gas and I part oxygen gas at an atmosphere pressure of 1 Pa for 12 hours at a power output of 300 W. The temperature of the substrate at this time was 300° C.

The alumina substrate film was observed with a scanning electron microscope at a magnification ratio of ×5000. The film was transparent and glassy. No defects such as pinholes, and cracks were observed.

In order to confirm the heat resistance of this substrate, the step of heating the substrate in air to 400° C. and then allowing it to cool naturally was repeated 5 times, and then the substrate was observed with a scanning electron microscope at a magnification ratio of ×5000. No defects such as cracks or pinholes were observed proving that the substrate is heat-resistant at a temperature of 400° C. Metal was then deposited on the alumina film applied using the magnetron sputtering device, and the dielectric strength of the film was measured by testing the electrical insulating properties of the metal film and carbon-based copper composite material using an electrical insulator tester. The dielectric strength of the film was between 500V and 650V. Furthermore, the specific resistivity of the film was measured to be at least $10^{12} \Omega$-m.

Comparative Example 8

A carbon-based copper composite material provided with a ceramics film was prepared in the same way as Example 10 except that a carbon formed body substrate having a copper filling percentage of 95 volume percent, a copper content of 45 volume percent and a thermal expansivity of $12.5 \times 10^{-6}$/° C. was used. When the substrate was heated to 250° C. and allowed to cool naturally to room temperature, cracks were observed in the ceramics film as a result of the difference in thermal expansivity between the carbon-based copper composite material and the ceramics film.

INDUSTRIAL APPLICABILITY

The carbon-based metal composite material of the present invention has at least 90 volume percent of the pores of the carbonaceous matrix substituted with a metal component, and has a metal component content of 35 volume percent or less. Its high thermal conductivity and low thermal expansivity make it useful as a heat disperser for an electronic component. It can also be used as a structural material for astronautical components or a general structural material having excellent specific strength and specific rigidity, and an extremely great industrial contribution has thus been made by the provision of this novel material.

Furthermore, the method of producing a carbon-based metal composite material according to the present invention is also useful as means for providing said composite material, and it is likewise of great industrial use in that it solves the problems associated with molten metal, particularly, aluminium impregnation which was considered as impossible in the prior art.

What is claimed is:

1. A carbon-based metal composite material comprising a carbonaceous matrix and a metal component dispersed in said carbonaceous matrix, characterized in that
    (1) the carbonaceous matrix is a pressure formed body comprising at least one type of carbon material selected from the group consisting of graphite crystalline carbon materials, carbon powder and artificial graphite powder;
    (2) at least 90 volume percent of the pores of the carbonaceous matrix is substituted with a metal component; and
    (3) the content of said metal component is 35% or less based on the total volume of said carbon-based metal composite material.

2. The carbon-based metal composite material according to claim 1 wherein the metal component is at least one metal selected from the group consisting of aluminmum, magnesium, tin, zinc, copper, silver, nickel and alloys thereof.

3. The carbon-based metal composite material according to claim 2 wherein said metal component is at least one pure metal component selected from the group consisting of alununium, copper and silver.

4. The carbon-based metal composite material according to claim 1 wherein the average interplanar spacing $\bar{d}_{002}$ of the graphite crystals of said graphite crystalline carbon material is 0.340 nm or less.

5. The carbon-based metal composite material according to claim 1 wherein at least 95 volume percent of the pores of said carbonaceous matrix is substituted with said metal component.

6. The carbon-based metal composite material according to any one of claims 1 to 3, wherein the content of said metal component is 5% to 30% based on the total volume of said carbon-based metal composite material.

7. A method of producing a carbon-based metal composite material comprising impregnating a carbon formed body with a molten metal by contacting said carbon formed body with said molten metal under pressure, characterized by (1) pre-heating said carbon formed body in an inert atmosphere to a temperature at least as high as the melting point of said molten metal, and (2) impregnating the pre-heated carbon formed body with said molten metal at a pressure of at least 200 kg per cm$^2$ of the plunger cross-sectional area wherein said carbon formed body is a graphite crystalline carbon material calcinated at a temperature of at least 2500° C. and having an average interplanar spacing $d_{002}$ of 0.340 nm or less.

8. The method of producing a carbon-based metal composite material according to claim 7 wherein said carbon formed body has a porosity of 5 volume percent to 30 volume percent.

9. The method of producing a carbon-based metal composite material according to claim 7 wherein said pre-heating temperature is at least 100° C. higher than the melting point of said molten metal.

10. The method of producing a carbon-based metal composite material according to claim 7 wherein said impregnation temperature is 50° C. to 250° C. higher than the melting point of said molten metal.

11. A carbon, based metal composite material for an electronic component characterized in that it is formed from a carbon-based metal composite material having a density of 2.0 g/ml to 2.5 g/ml, a thermal conductivity of at least 150 W/m·K and a thermal expansivity of $4\times10^{-6}/°$ C. to $8\times10^{-6}/°$ C., which comprises a carbonaceous matrix and aluminum or aluminum alloy dispersed in said carbonaceous matrix, characterized in that (1) the carbonaceous matrix is a pressure formed body comprising at least one type of carbon material selected from the group consisting of graphite crystalline carbon materials, carbon powder and artificial graphite powder;

(2) at least 90 volume percent of the pores of the carbonaceous matrix is substituted with a metal component; and (3) the content of said metal component is 35% or less based on the total volume of said carbon-based metal composite material.

12. The substrate-shaped formed body for an electronic component according to claim 11 wherein said substrate-shaped formed body has a thickness of 0.1 mm to 20 mm.

13. The substrate-shaped formed body for an electronic component according to claim 11, wherein said carbon formed body is a cooling device-fitted substrate obtained by integration via metal with a cooling device having a liquid as the cooling medium.

14. A carbon-based metal composite material provided with an insulating film obtained by covering the surface of a carbon-based metal composite material according to claim 1 or a carbon-based metal composite material obtained by a method according to claim 8 with an insulating material.

15. The carbon-based metal composite material provided with an insulating film according to claim 14 wherein said insulating material is a plastic or ceramics material.

16. The carbon-based metal composite material provided with an insulating film according to claim 14 wherein the thickness of said covering layer of insulating material is 0.6 mm or less.

17. A carbon based metal composite material for an electronic component characterized in that it is formed from a carbon-based metal composite material, having a density of 2.3 g/ml to 4.6 g/ml, a thermal conductivity of at least 150 W/m·K) and a thermal expansivity of $4\times10^{-6}/°$ C. to $12\times10^{-6}/°$ C., which comprises a carbonaceous matrix and copper, silver or an alloy thereof dispersed in said carbonaceous matrix, characterized in that (1) the carbonaceous matrix is a pressure formed body comprising at least one type of carbon material selected from the group consisting of graphite crystalline carbon materials, carbon powder and artificial graphite powder;

(2) at least 90 volume percent of the pores of the carbonaceous matrix is substituted with a metal component; and (3) the content of said metal component is 35% or less based on the total volume of said carbon-based metal composite material.

* * * * *